(12) United States Patent
Wang et al.

(10) Patent No.: US 10,896,926 B2
(45) Date of Patent: Jan. 19, 2021

(54) ARRAY SUBSTRATE, METHOD FOR CONTROLLING THE SAME, AND DISPLAY DEVICE

(71) Applicants: BOE Technology Group Co., Ltd., Beijing (CN); Beijing BOE Display Technology Co., Ltd., Beijing (CN)

(72) Inventors: Ruiyong Wang, Beijing (CN); Ruizhi Yang, Beijing (CN); Yang You, Beijing (CN); Yun Qiu, Beijing (CN); Huijuan Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 250 days.

(21) Appl. No.: 16/069,222

(22) PCT Filed: Dec. 12, 2017

(86) PCT No.: PCT/CN2017/115592
§ 371 (c)(1),
(2) Date: Jul. 11, 2018

(87) PCT Pub. No.: WO2018/223644
PCT Pub. Date: Dec. 13, 2018

(65) Prior Publication Data
US 2020/0176502 A1  Jun. 4, 2020

(30) Foreign Application Priority Data
Jun. 9, 2017 (CN) .......................... 2017 1 0434368

(51) Int. Cl.
*G02F 1/29* (2006.01)
*H01L 27/146* (2006.01)
(Continued)

(52) U.S. Cl.
CPC .......... *H01L 27/14643* (2013.01); *G02F 1/29* (2013.01); *H01L 27/124* (2013.01);
(Continued)

(58) Field of Classification Search
CPC .......................... G02F 1/13338; H01L 27/124
See application file for complete search history.

(56) References Cited

U.S. PATENT DOCUMENTS

2006/0279690 A1* 12/2006 Yu ...................... H04N 1/00129
349/199
2009/0231511 A1  9/2009 Takahashi et al.
(Continued)

FOREIGN PATENT DOCUMENTS

CN  1811532 A  8/2006
CN  101424855 A  5/2009
(Continued)

OTHER PUBLICATIONS

International Search Report and Written Opinion, including English translation of Box V, of the Written Opinion, for International Application No. PCT/CN2017/115592, dated Feb. 24, 2018, 6 pages.

*Primary Examiner* — Thanh Luu
(74) *Attorney, Agent, or Firm* — Westman, Champlin & Koehler, P.A.

(57) ABSTRACT

The present disclosure provides an array substrate, a method for controlling the same, and a display device. The array substrate comprises: a base substrate; and an array of first thin film transistors, a signal line array, a photosensor array and a receiving line array, each provided on the base substrate. Each first thin film transistor in the array of first thin film transistors is connected to one signal line of the signal line array. Each photosensor in the photosensor array
(Continued)

is connected to one signal line in the signal line array and one receiving line in the receiving line array.

18 Claims, 8 Drawing Sheets

(51) Int. Cl.
*H01L 27/12* (2006.01)
*H04N 5/369* (2011.01)
*H04N 5/374* (2011.01)

(52) U.S. Cl.
CPC .. *H01L 27/14614* (2013.01); *H01L 27/14627* (2013.01); *G02F 2001/294* (2013.01); *H04N 5/3698* (2013.01); *H04N 5/374* (2013.01)

(56) References Cited

U.S. PATENT DOCUMENTS

| | | | |
|---|---|---|---|
| 2011/0069254 A1* | 3/2011 | Takama | G02B 3/14 349/62 |
| 2015/0029158 A1 | 1/2015 | Kim et al. | |
| 2019/0026530 A1 | 1/2019 | Wu et al. | |

FOREIGN PATENT DOCUMENTS

| | | |
|---|---|---|
| CN | 102338946 A | 2/2012 |
| CN | 102954836 B | 4/2015 |
| CN | 106022276 A | 10/2016 |
| CN | 106022324 A | 10/2016 |

\* cited by examiner

ARRAY SUBSTRATE, METHOD FOR CONTROLLING THE SAME, AND DISPLAY DEVICE

CROSS-REFERENCE TO RELATED APPLICATION(S)

This application is a Section 371 National Stage application of International Application No. PCT/CN2017/115592, filed on 12 Dec. 2017, which has not yet published and claims priority to Chinese Patent Application No. 201710434368.2, filed on Jun. 9, 2017, the contents of which are incorporated herein by reference in their entirety.

TECHNICAL FIELD

The present disclosure relates to the field of display technologies, and more particularly, to an array substrate, a method for controlling the same, and a display device.

BACKGROUND

Devices or elements for realizing various functions, such as a photosensor array for acquiring optical information and the like, may be integrated in an conventional array substrate. However, in such an array substrate, an aperture ratio of the array substrate may be affected due to the presence of the integrated devices and lines.

SUMMARY

Embodiments of the present disclosure provide a display panel, a method for controlling the same, and a display device. According to a first aspect of the present disclosure, there is provided an array substrate, comprising: a base substrate; and an array of first thin film transistors, a signal line array, a photosensor array and a receiving line array, each provided on the base substrate. Each first thin film transistor in the array of first thin film transistors is connected to one signal line in the signal line array, and each photosensor in the photosensor array is connected to one signal line in the signal line array and one receiving line in the receiving line array.

In an embodiment, lenses are provided on at least one photosensor in the photosensor array on a side thereof away from the base substrate, so as to form a lens array.

In an embodiment, each of the lenses is selected from a micro-lens array, a Fresnel lens or a liquid crystal lens.

In an embodiment, in a case that the lenses are liquid crystal lenses, each of the liquid crystal lenses comprises a liquid crystal layer and a control electrode configured to control a focal length of the liquid crystal lens.

In an embodiment, the liquid crystal lenses are provided on a light exiting side of the array substrate.

In an embodiment, each photosensor in the photosensor array comprises a second thin film transistor and a photoelectric converter, wherein the second thin film transistor has a gate connected to the signal line and a negative electrode of the photoelectric converter, a first electrode connected to a positive electrode of the photoelectric converter, and a second electrode connected to the receiving line.

In an embodiment, the second thin film transistor comprises an active layer. The base substrate has a base layer, the active layer, a first insulating layer, a second insulating layer and a third insulating layer provided thereon in an order from bottom to top, wherein the first insulating layer and the second insulating layer have a first via hole provided therein, the second insulating layer has a second via hole provided therein, the first insulating layer, the second insulating layer, and the third insulating layer have a third via hole provided therein, and orthogonal projections of the first via hole, the second via hole and the third via hole on the base substrate are all within a range of an orthogonal projection of the active layer on the base substrate. The gate is provided in the second via hole, and the photoelectric converter is provided on the gate, the first electrode is provided on the second insulating layer and is electrically connected to the active layer through the first via hole, the second electrode is provided in the third via hole and is electrically connected to the active layer, and the receiving line is provided on the third insulating layer and is electrically connected to the second electrode through the third via hole, wherein the receiving line and the second electrode are formed by the same patterning process.

In an embodiment, the first electrode is made of a transparent conductive material.

In an embodiment, an ohmic contact layer is further formed at a position where at least one of the first electrode and the second electrode is in contact with the active layer.

In an embodiment, the base substrate further comprises a data line array provided thereon, wherein an arrangement direction of receiving lines in the receiving line array is parallel to an arrangement direction of data lines in the data line array or an arrangement direction of signal lines in the signal line array.

In an embodiment, the array substrate is divided by the signal lines and the data lines into a plurality of sub-pixel regions in a crisscross manner, wherein a number of photosensors in the photosensor array is less than or equal to a number of the sub-pixel regions.

In an embodiment, the photosensor array comprises a preset number of photosensors.

In an embodiment, a photosensor is provided in every n sub-pixel regions along at least one of the arrangement direction of the data lines and the arrangement direction of the signal lines, where n is an integer greater than or equal to 2.

In an embodiment, the photosensor array is located in an opening region of the array substrate.

According to a second aspect of the present disclosure, there is provided a method for controlling an array substrate, which is used for the array substrate according to the first aspect, the method comprising: controlling, through the signal lines, the photosensors to be turned on; receiving, through the receiving lines, electrical signals generated by the photosensors; and acquiring optical information according to the electrical signals.

In an embodiment, the step of controlling, through the signal lines, the photosensors to be turned on comprises: controlling, through voltages in the signal lines, the photosensors to be turned on while controlling, through the voltages, the array substrate to be used for display.

In an embodiment, the step of acquiring optical information according to the electrical signals comprises:

screening out at least one valid electrical signal from the electrical signals acquired through various receiving lines, wherein a voltage of the valid electrical signal is greater than a voltage of a corresponding signal line;

acquiring a standard value $\varphi$ of each valid electrical signal according to the following formula:

$$\varphi = \frac{V_p - V_g}{V_g},$$

where $V_p$ is the voltage of the valid signal and $V_g$ is the voltage of the signal line; and acquiring the optical information according to the standard value of the valid electrical signal.

According to a third aspect of the present disclosure, there is provided a method for manufacturing an array substrate, which is used to manufacture the array substrate according to the first aspect.

According to a fourth aspect of the present disclosure, there is provided a display device, comprising the array substrate according to the first aspect.

BRIEF DESCRIPTION OF THE ACCOMPANYING DRAWINGS

In order to more clearly illustrate the technical solutions in the embodiments of the present disclosure, the accompanying drawings used in the description of the embodiments will be briefly described below. It is obvious that the accompanying drawings in the following description are only some embodiments of the present disclosure. Other accompanying drawings may also be acquired by those of ordinary skill in the art according to these accompanying drawings without any creative work.

FIG. 2-1 is a schematic structural diagram of another array substrate according to an embodiment of the present disclosure;

FIG. 2-2 is a schematic structural diagram of another array substrate according to an embodiment of the present disclosure;

FIG. 2-3 is a schematic structural diagram of another array substrate according to an embodiment of the present disclosure;

FIG. 2-4 is schematic structural diagram of another array substrate according to an embodiment of the present disclosure;

FIG. 2-5 is schematic structural diagram of another array substrate according to an embodiment of the present disclosure;

FIG. 2-6 is schematic structural diagram of another array substrate according to an embodiment of the present disclosure;

FIG. 2-7 is a schematic circuit diagram of the array substrate shown in FIG. 2-6;

FIG. 2-8 is a response curve of the photoelectric converter in the embodiment shown in FIG. 2-1 to current and a voltage;

FIG. 3-1 is a flowchart of a method for controlling an array substrate according to an embodiment of the present disclosure;

FIG. 3-2 is a flowchart of acquiring optical information according to an electrical signal in the embodiment shown in FIG. 3-1; and FIG. 3-3 is a schematic diagram of level signals on signal lines, data lines, and receiving lines in the embodiment shown in FIG. 3-1.

The embodiments of the present disclosure have been shown by the above accompanying drawings, and will be described in more detail later. The accompanying drawings and the text description are not intended to limit the scope of the present disclosure in any way, and are intended to convey the concepts of the present disclosure to those skilled in the art by referring to specific embodiments.

DETAILED DESCRIPTION

In order to make the purposes, technical solutions and advantages of the present disclosure more clear, the embodiments of the present disclosure will be further described in detail below with reference to the accompanying drawings.

Figure 1:
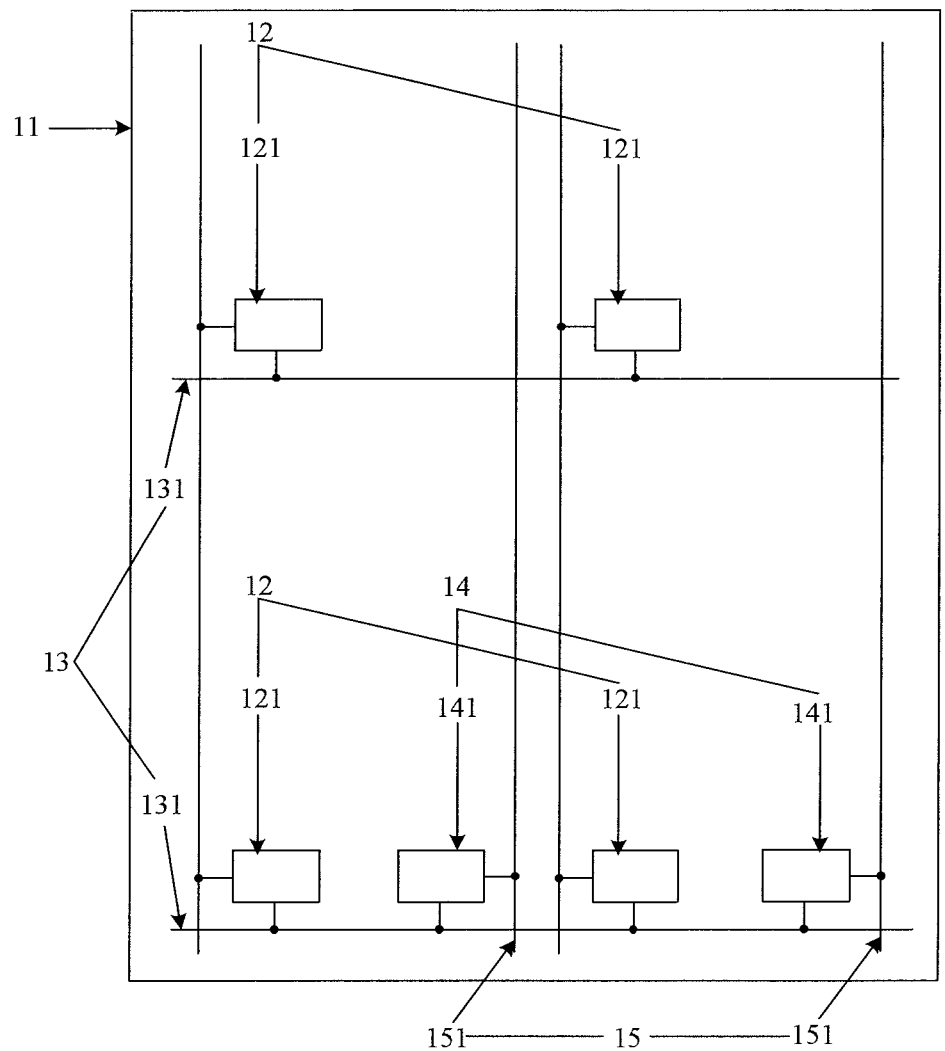
FIG. 1 is a schematic structural diagram of an array substrate according to an embodiment of the present disclosure.

FIG. 1 is a schematic structural diagram of an array substrate according to an embodiment of the present disclosure. The array substrate may comprise:

a base substrate 11.

The base substrate 11 has the following arrays provided thereon: a array 12 of first thin film transistors configured to perform a display control function and including a plurality of first thin film transistors 121, a signal line array 13 including a plurality of signal lines 131, a photosensor array 14 including a plurality of photosensors 141 and a receiving line array 15 including a plurality of receiving lines 151, wherein each first thin film transistor 121 in the array 12 of first thin film transistors is connected to one signal line 131 in the signal line array 13. When the signal lines in the signal line array are arranged longitudinally (the longitudinal arrangement means that an arrangement direction of the plurality of signal lines on the base substrate 11 is a longitudinal direction, and the arrangement direction may refer to an arrangement direction of the plurality of signal lines in the signal line array, which may be perpendicular to a lengthwise direction of the signal lines), each row of first thin film transistors 121 may be connected to the same signal line 131, and each column of first thin film transistors 121 may be connected to different signal lines 131. When the signal lines in the signal line array are arranged laterally, each row of first thin film transistors 121 may be connected to different signal lines 131, and each column of first thin film transistors 121 may be connected to the same signal line 131. In an embodiment, the signal line array 13 may be a gate line array including a plurality of gate lines.

Each photosensor 141 in the photosensor array 14 is connected to one signal line in the signal line array 13, and a signal line connected to each photosensor is used to control the photosensor.

Each photosensor 141 in the photosensor array 14 is connected to one receiving line in the receiving line array 15, which is used to receive optical information acquired by the photosensor array 14.

In summary, the array substrate according to the embodiment of the present disclosure reduces lines to be provided and increases an aperture ratio of the array substrate by sharing the signal lines between the photosensors and the thin film transistors for display control. The present disclosure solves the problem of providing a large number of lines and devices in the array substrate in the related art which may affect the aperture ratio of the array substrate. The present disclosure achieves an effect that the photosensors can be provided on the array substrate in a case where a small number of lines are provided.

Figures 1, 2:
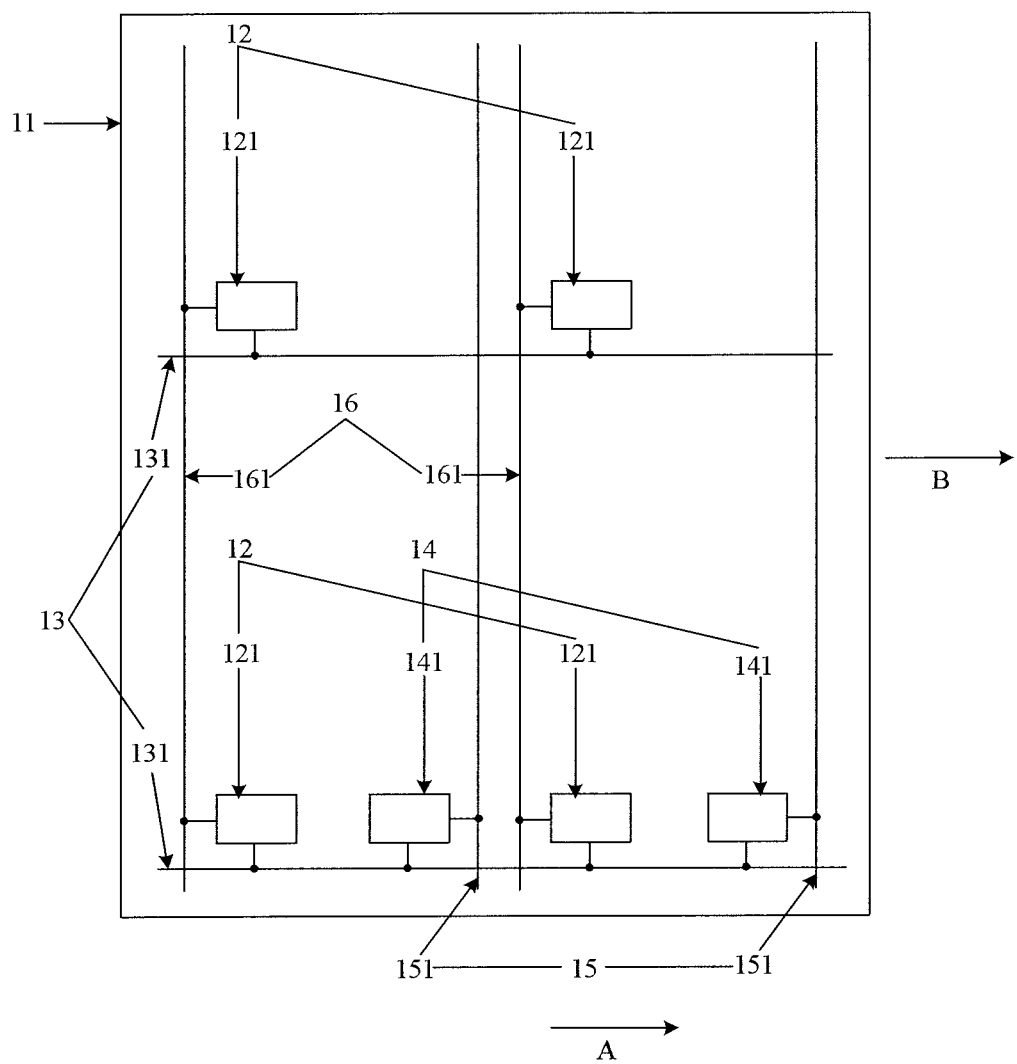
Figure 2:
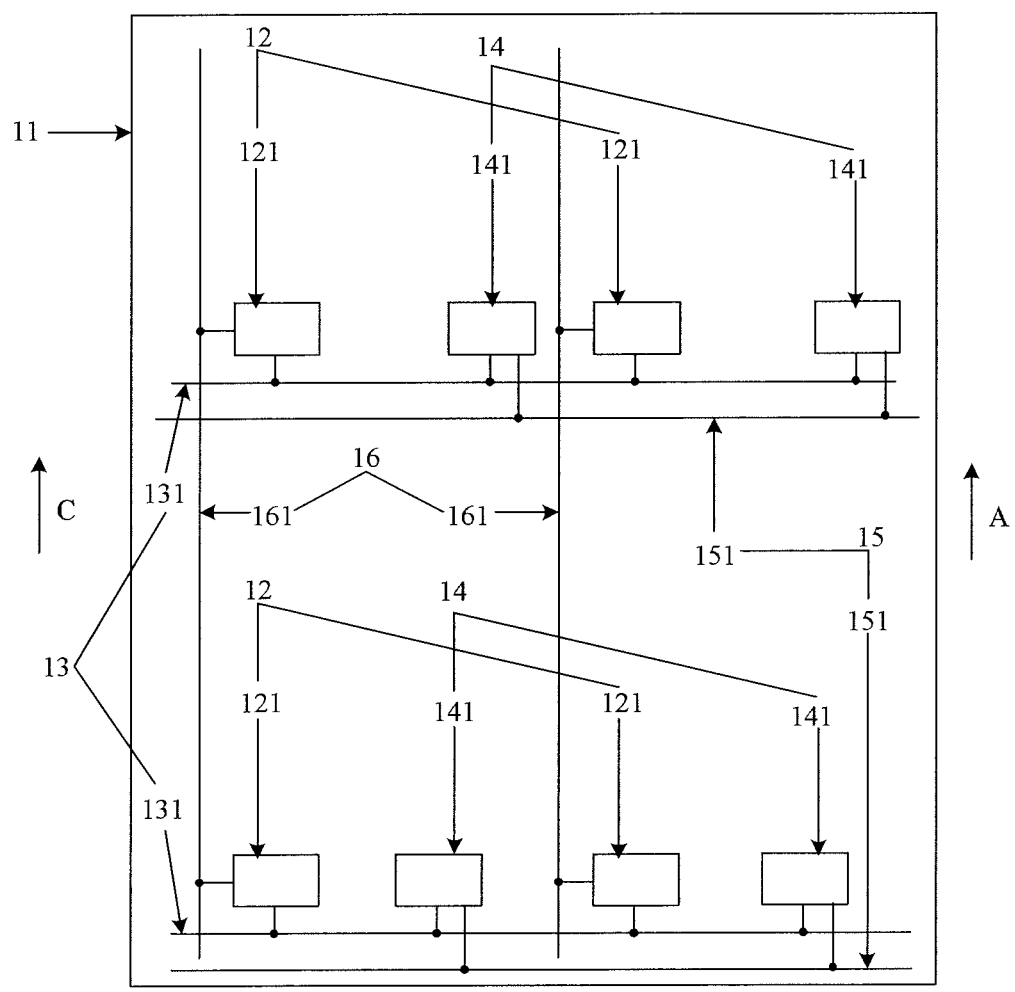

Further, as shown in FIG. 2-1, illustrated is a schematic structural diagram of another array substrate according to an embodiment of the present disclosure, which adds more preferable components on the basis of the array substrate shown in FIG. 1. Thereby, the array substrate according to the embodiment of the present disclosure has better performance.

In an embodiment, the array substrate 10 further comprises a data line array 16 including a plurality of data lines 161 provided thereon. The array substrate is divided by the plurality of signal lines 131 and the plurality of data lines 161 into a plurality of sub-pixel regions, which may be rectangular, square or in another shape.

A number of the photosensors in the photosensor array 14 is less than or equal to a number of the sub-pixel regions.

In an embodiment, the photosensor array 14 comprises a preset number of photosensors. That is, the number of the photosensors may be preset directly.

The photosensor array 14 may be formed by vapor deposition, sputtering or spin coating in combination with a photolithography process or a laser process.

In an embodiment, in the plurality of sub-pixel regions, one photosensor is provided in every n sub-pixel regions along at least one of an arrangement direction of the data lines 161 and an arrangement direction of the signal lines 131, where n is an integer greater than or equal to 2. That is, the photosensors may be evenly distributed in various regions of the array substrate, so that the number of the photosensors can be reduced in a case where there is a photosensor in each region.

In an embodiment, in the array 12 of first thin film transistors, the first thin film transistors 121 may be double-gate-type polysilicon thin film transistors. The polysilicon thin film transistors have a faster switch speed than that of the thin film transistors in the related art.

When the sub-pixel regions in the array substrate are all rectangular, and long sides of the sub-pixel regions are parallel to the signal lines 131, an arrangement direction A of the receiving lines 151 in the receiving line array 15 is parallel to an arrangement direction B of the data lines 161 in the data line array 16. In this way, a length of the receiving lines in the receiving line array 15 can be reduced, thereby reducing an area occupied by the receiving lines on the array substrate and increasing the aperture ratio of the array substrate. The same column of photosensors may be connected to the same receiving line, and the same row of photosensors may be connected to the same signal line, so that the photosensor array can be controlled in a similar manner to that of controlling the array of first thin film transistors. That is, electrical signals transmitted by various photosensors may be acquired respectively by powering on the signal lines progressively.

In FIG. 2-1, each photosensor in the photosensor array may occupy an area of 1 square microns to 10,000 square microns on the array substrate.

In an embodiment, the photosensor array 14 is located in an opening region of the array substrate, and there is no light blocking structure above the photosensors in the photosensor array 14, such as a Black Matrix (BM) and the like in a color film substrate.

Meanings of other signs in FIG. 2-1 can be known with reference to FIG. 1, and details thereof will not be described here again.

When the sub-pixel regions in the array substrate are all rectangular, and short sides of the sub-pixel regions are parallel to the signal lines 131, the array substrate 10 according to the embodiment of the present disclosure may be as shown in FIG. 2-2, wherein the arrangement direction A of the receiving lines 151 in the receiving line array 15 is parallel to an arrangement direction C of the signal lines 131 in the signal line array 13. In this way, the length of the receiving lines in the receiving line array 15 can also be reduced, thereby reducing the area occupied by the receiving lines on the array substrate and increasing the aperture ratio of the array substrate. Meanings of other signs in FIG. 2-2 can be known with reference to FIG. 2-1, and details thereof will not be described here again.

Figures 2, 3:
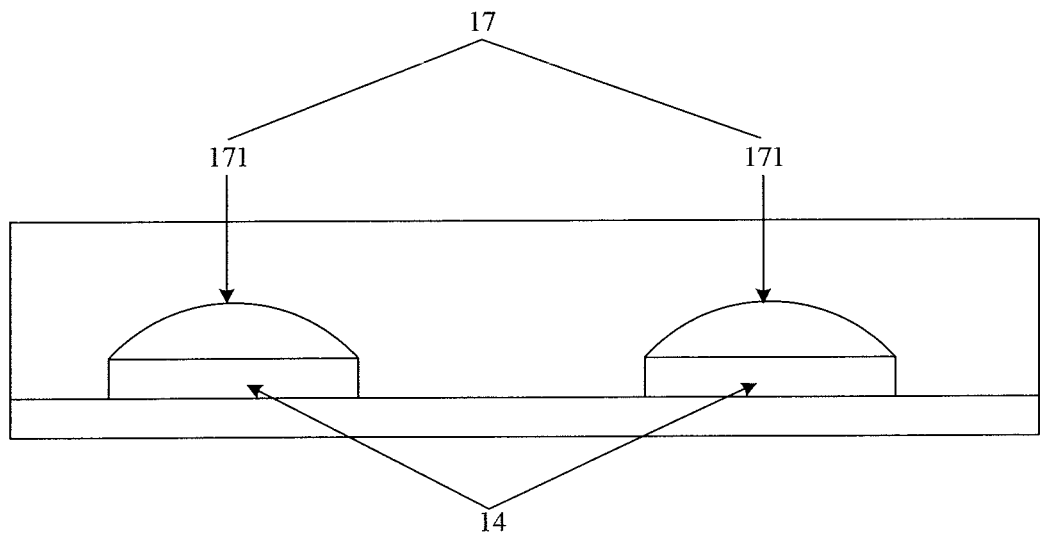

As shown in FIG. 2-3, the array substrate further comprises a lens array 17 including a plurality of lenses 171 provided thereon. The lens array 17 is located on a side of the photosensor array 14 which is away from the base substrate 11, and the lenses in the lens array 17 are in one-to-one correspondence with all or a part of the photosensors in the photosensor array 14. The lenses in the lens array 17 may be formed by an imprinting, etching or grinding process, and a material of the lenses may comprise an organic resin or a silicon-based organic resin or glass. The lens array 17 is capable of increasing the light utilization of the photosensor array 14.

In an embodiment, each lens in the lens array 17 is a Fresnel lens which is capable of reducing a thickness of the lens array 17. The Fresnel lens, also known as threaded lens, is a sheet made of a polyolefin material or glass through injection molding. A surface of the lens is smooth on one side and have concentric circles carved from small to large on the other side. The concentric circles are designed according to requirements for light interference, light disturbance, relative sensitivity and a receiving angle.

Figures 2, 3, 4:
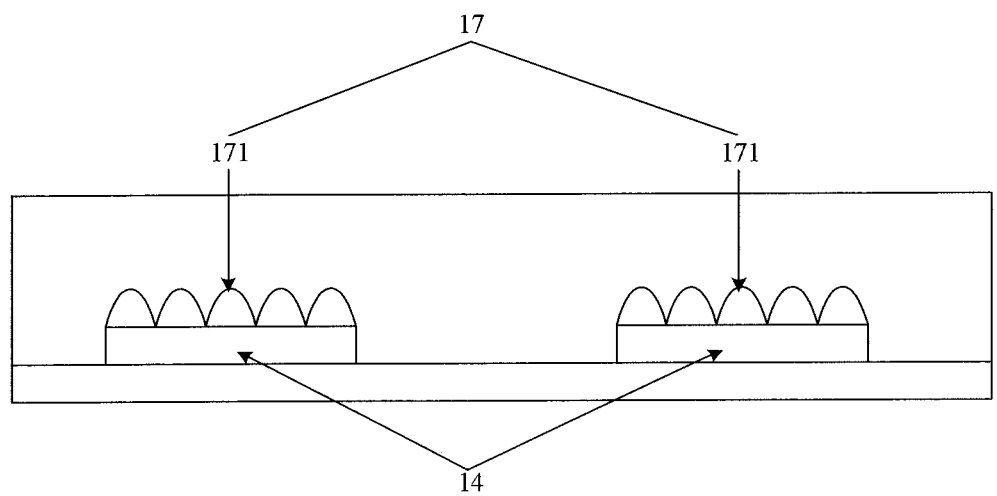
Figures 2, 3, 4, 5:
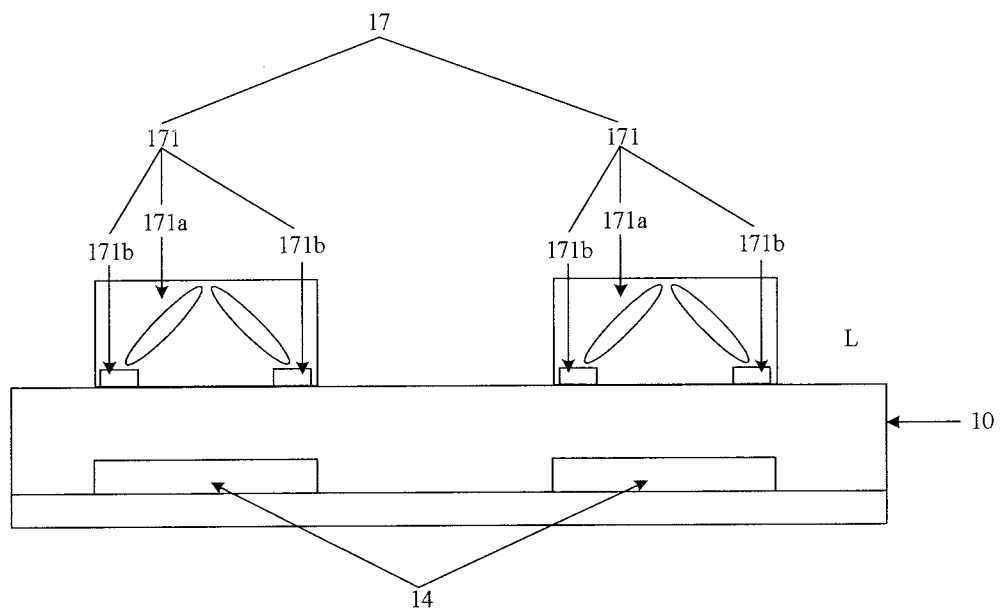
Figures 2, 3, 4, 5, 6:
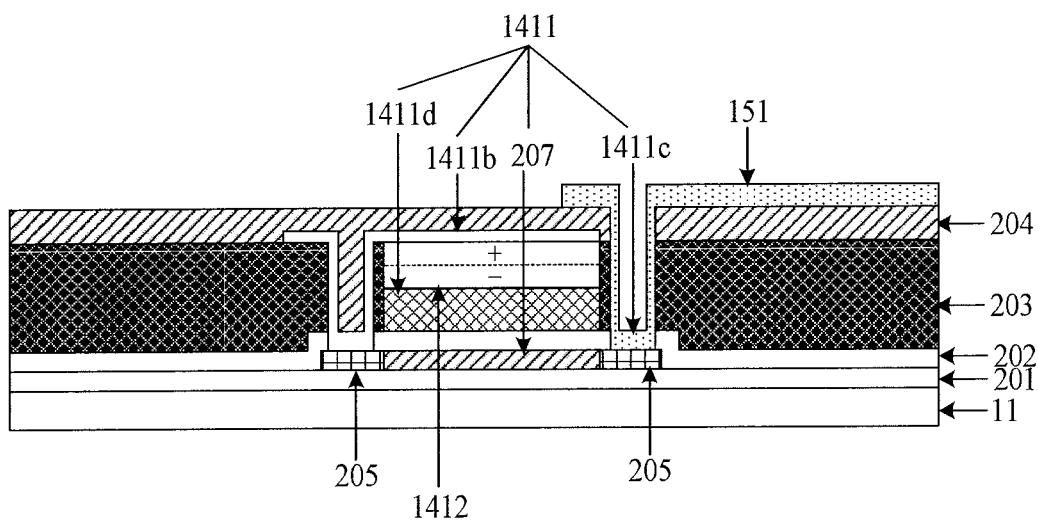
Figures 2, 3, 4, 5, 6, 7:
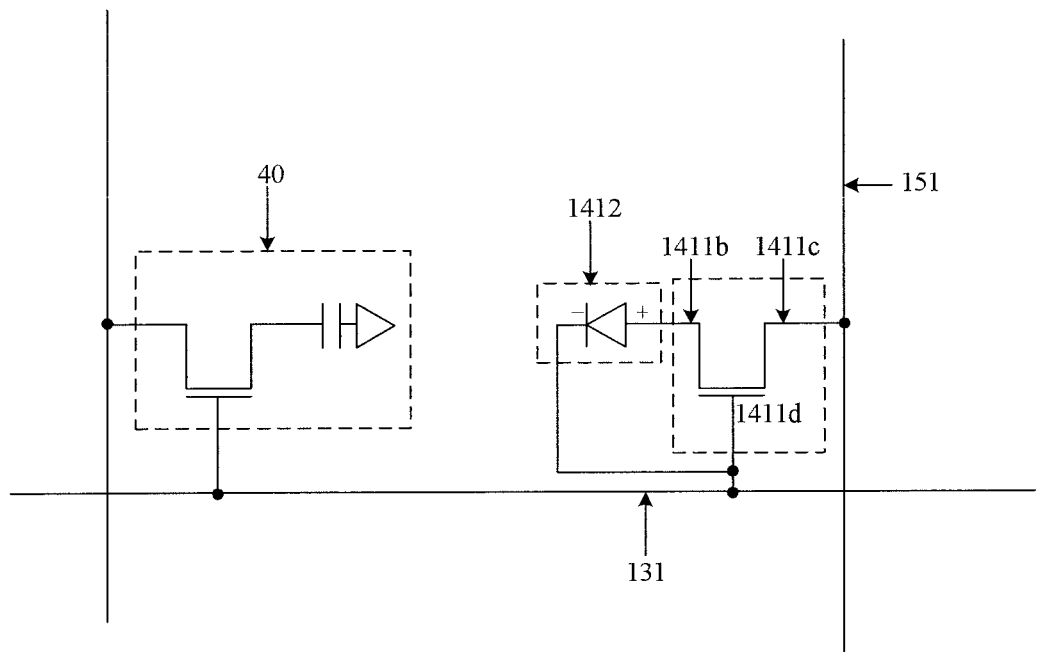
Figures 2, 3, 4, 5, 6, 7, 8:
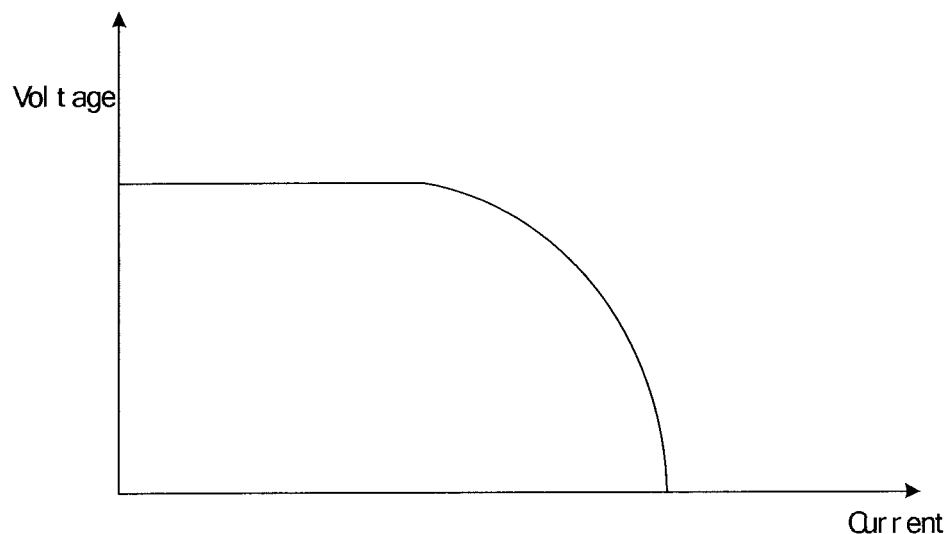
Figures 1, 3:
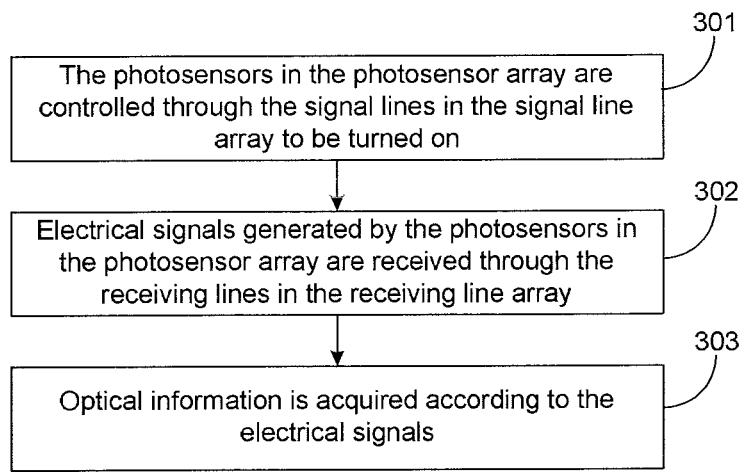
Figures 2, 3:
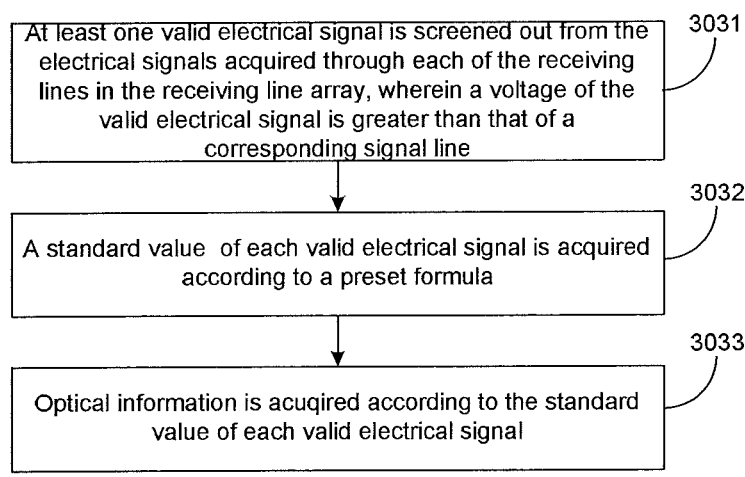
Figure 3:
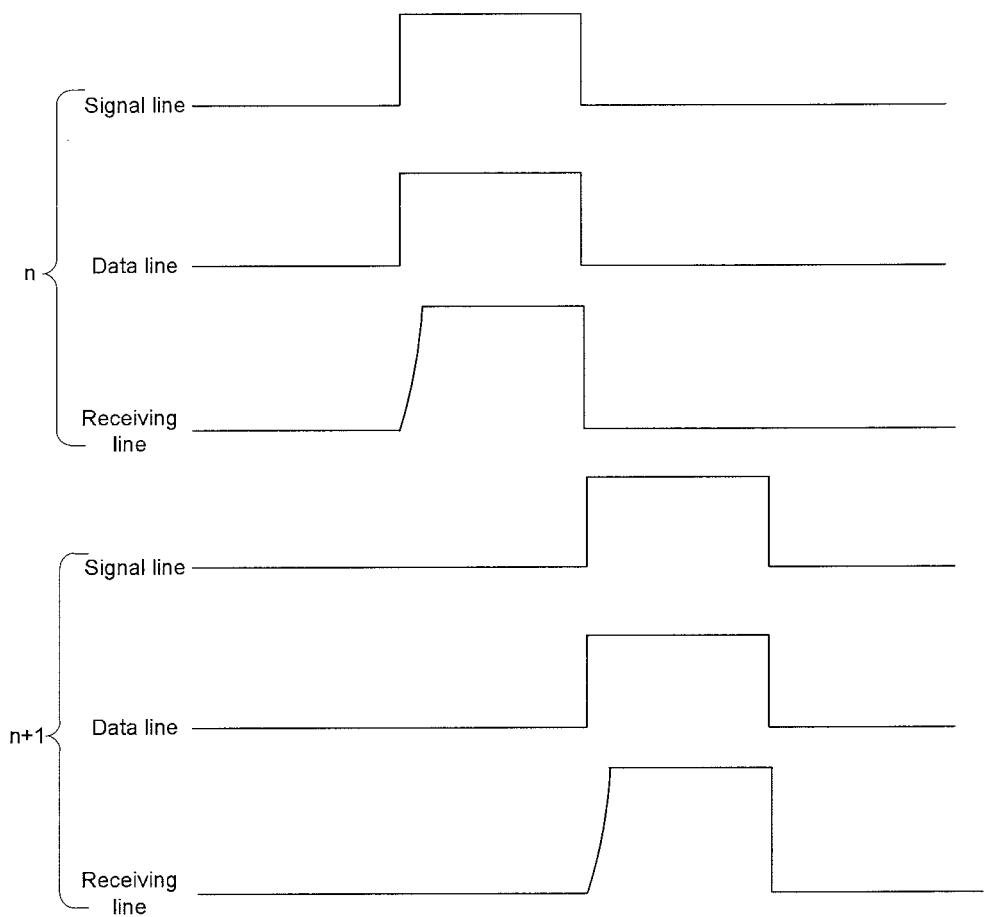

In an embodiment, as shown in FIG. 2-4, illustrated is a schematic structural diagram of another array substrate according to the embodiment of the present disclosure, wherein each lens in the lens array 17 is a micro-lens array including a plurality of micro-lenses arranged in an array, which can increase the light utilization and reduce a thickness of the lenses.

Depending on different focal lengths of the lenses in the lens array 17, the photosensor array 14 can implement different functions such as fingerprint recognition, copying and scanning, image recognition, face recognition, light detection, and distance detection and the like. As an example, when the focus of the lenses in the lens array 17 is located on an outer surface of a light exiting side of the array substrate, the photosensor array 14 can be used to implement functions such as fingerprint recognition and image recognition and the like, when the focal length of the lenses in the lens array 17 is 20 cm to 50 cm, the lens array 17 can be used to implement functions such as face recognition and the like, and when the focal length of the lenses in the lens array 17 is greater than 1 m, the lens array 17 can be used to implement functions such as light detection and distance detection and the like.

In addition, the lenses in the lens array 17 may also be provided as a filter structure through which only light with a preset wavelength can pass, so as to further increase the accuracy of the photosensor array 14.

The array substrate according to the embodiment of the present disclosure may be a liquid crystal array substrate, an Organic Light Emitting Diode (OLED) array substrate, a Quantum dot Light Emitting Diode (QLED) array substrate, or another array substrate composed of micro-display structures.

As shown in FIG. 2-5, illustrated is a schematic structural diagram of another array substrate according to an embodiment of the present disclosure, wherein the lens array 17 is a liquid crystal lens array including a plurality of liquid crystal lenses, and any one of the liquid crystal lenses 171 in the lens array 17 comprises a liquid crystal layer 171a and a control electrode 171b. The control electrode 171b may be provided in the liquid crystal layer 171a, or may also be provided on both sides or either side of the liquid crystal layer 171a, and the control electrode 171b may be used to control a focal length of any one of the liquid crystal lenses.

The control electrode 171b may generate an electric field in the liquid crystal layer, and liquid crystal in the liquid crystal layer 171a may be deflected by the electric field, thereby achieving the effect of changing the focal length of the liquid crystal lens. The control electrode 171b may be made of a transparent material such as indium tin oxide and the like.

When the lens array 17 is a liquid crystal lens array, different functions can be realized by changing the focal length. The functions which can be realized can be known with reference to the array substrate shown in FIG. 2-4.

In an embodiment, the lens array 17 is provided on the light exiting side L of the array substrate 10. The lens array 17 is provided on the light exiting side L of the array substrate 10, which can prevent electrodes in the lens array 17 from affecting devices (such as liquid crystal layers) in the array substrate 10 when the lens array 17 is provided on the array substrate 10.

In addition, the lens array 17 may further comprise an entire liquid crystal layer covering the light exiting side of the array substrate, and each of the liquid crystal lenses may be located in the liquid crystal layer.

As shown in FIG. 2-6, illustrated is a schematic structural diagram of another array substrate according to an embodiment of the present disclosure. Here, any one of the photosensors 141 in the photosensor array 14 comprises a second thin film transistor 1411 and a photoelectric converter 1412. The second thin film transistor 1411 comprises an active layer 207, a first electrode 1411b, a second electrode 1411c, and a gate 1411d.

The gate 1411d is connected to a preset signal line in the signal line array (such as the signal line array 13 in FIG. 2-1), the first electrode 1411b is connected to a positive electrode + of the photoelectric converter 1412, the second electrode 1411c is connected to a preset receiving line in the receiving line array (such as the receiving line array 15 in FIG. 2-1), and a negative electrode − of the photoelectric converter 1412 is connected to the gate 1411d. The preset signal line and the preset receiving line may be a signal line and a receiving line in a sub-pixel region where the photosensor 141 is located.

A material of the photoelectric converter 1412 may comprise semiconductor materials such as a quantum dot material, a doped silicon-based material, Gallium Arsenide (GaAs), Gallium Aluminum Arsenide (GaAlAs), Indium Phosphide (InP), Cadmium Sulfide (CdS), and Cadmium Telluride (CdTe) and the like. All or a part of the photoelectric converters 1412 may have a photovoltaic effect for light with a wavelength of 300 nm to 2000 nm.

In an embodiment, the active layer 207 is provided on the base substrate 11.

In an embodiment, a base layer 201 is provided between the active layer 207 and the base substrate 11. The base layer 201 is used to protect the active layer 207.

A first insulating layer 202 is provided on the active layer 207, a second insulating layer 203 is provided on the first insulating layer 202, and a third insulating layer 204 is provided on the second insulating layer 203.

The first insulating layer 202 and the second insulating layer 203 each have a first via hole provided therein, the second insulating layer 203 has a second via hole provided therein, and the first insulating layer 202, the second insulating layer 203, and the third insulating layer 204 each have a third via hole provided therein. Orthogonal projections of the first via hole, the second via hole and the third via hole on the base substrate 11 are at least partly overlapped with an orthogonal projection of the active layer 207 on the base substrate 11.

In an embodiment, the orthogonal projections of the first via hole, the second via hole and the third via hole on the base substrate 11 are all within a range of the orthogonal projection of the active layer 207 on the base substrate 11.

The gate 1411d is provided in the second via hole, the photoelectric converter 1412 is provided on the gate 1411d, and the negative electrode − of the photoelectric converter 1412 is in contact with the gate 1411d.

The first electrode 1411b is provided on the second insulating layer 203, and the first electrode 1411b is in contact with the positive electrode of the photoelectric converter 1412, and is electrically connected to the active layer 207 through the first via hole.

The second electrode 1411c is provided in the third via hole, and the second electrode 1411c is electrically connected to the active layer 207.

The preset receiving line 151 is provided on the third insulating layer 204, and the preset receiving line 151 is electrically connected to the second electrode 1411c through the third via hole.

Preferably, the second electrode 1411c and the preset receiving line 151 are made of the same material and are formed by the same patterning process to simplify the process.

It should be illustrated that an order in which various structures in FIG. 2-6 are formed and a manner for forming various structures in FIG. 2-6 are not limited in the embodiment of the present disclosure.

In an embodiment, the first electrode 1411b is made of a transparent conductive material (such as indium tin oxide). When the first electrode 1411b is made of a transparent conductive material, the first electrode 1411b may be covered on the positive electrode + of the photoelectric converter 1412, so that a contact area of the first electrode 1411b and the positive electrode + can be increased without blocking light from entering the photoelectric converter 1412, thereby increasing the photoelectric conversion efficiency of the photoelectric converter 1412; and/or the negative electrode − of the photoelectric converter 1412 may be covered on the gate 1411d, so that a contact area of the gate 1411d and the negative electrode − can be increased, thereby increasing the photoelectric conversion efficiency of the photoelectric converter 1412.

In an embodiment, an ohmic contact layer 205 is further provided at a location where the first electrode 1411b and/or the second electrode 1411c are in contact with the active layer 207. The ohmic contact layer 205 may be provided in the same layer as that of the active layer 207 and may be in contact with the active layer 207, and the first electrode 1411b and the second electrode 1411c may be in contact with the top of the ohmic contact layer 205, respectively. The ohmic contact layer 205 enables the first electrode 1411b and the second electrode 1411c to be in ohmic contact with the active layer, thereby reducing a contact resistance between the active layer 207 and the first electrode 1411b and a contact resistance between the active layer 207 and the second electrode 1411c. A material of the ohmic contact layer 205 can be known with reference to the related art.

As shown in FIG. 2-7, illustrated is a circuit structure diagram of the array substrate shown in FIG. 2-6, wherein 40 is a display structure, and the photoelectric converter 1412 may be equivalent to a diode in the circuit, which has a positive electrode + connected to the first electrode 1411b, a negative electrode − connected to the gate 1411d, and a second electrode 1411c connected to the receiving line 151. 131 is a signal line.

As shown in FIG. 2-8, illustrated is a response curve of the photoelectric converter in the embodiment of the present disclosure to current and a voltage. It can be seen from the curve that an open circuit voltage and closed circuit current of the photoelectric converter are zero.

In summary, the array substrate according to the embodiment of the present disclosure reduces lines to be provided and increases an aperture ratio of the array substrate by sharing the signal lines between the photosensors and the thin film transistors for display control. The present disclosure solves the problem of providing a large number of lines and devices in the array substrate in the related art which may affect the aperture ratio of the array substrate. The present disclosure achieves an effect that the photosensors can be provided on the array substrate in a case where a small number of lines are provided.

FIG. 3-1 is a flowchart of a method for controlling an array substrate according to an embodiment of the present disclosure, which is used in the array substrate according to various embodiments described above. The method comprises the following steps.

In step 301, the photosensors in the photosensor array are controlled through the signal lines in the signal line array to be turned on.

The photosensors in the photosensor array may be controlled through voltages in the signal lines to be turned on when the array substrate is used for display. An execution body in the embodiment of the present disclosure may be a control circuit external to the array substrate.

In the embodiment of the present disclosure, the photosensors may also be turned on by applying voltages to the signal lines when the array substrate is not used for display.

In addition, the method according to the embodiment of the present disclosure may also control the photosensors when the array substrate is not used for display.

In step 302, electrical signals generated by the photosensors in the photosensor array are received through the receiving lines in the receiving line array.

When the electrical signals on the signal lines are sequentially transmitted to the respective rows of signal lines, the control circuit may sequentially acquire the electrical signals generated by the respective rows of photosensors.

In step 303, optical information is acquired according to the electrical signals.

Here, any one of the photosensors in the photosensor array comprises a second thin film transistor and a photoelectric converter. The second thin film transistor comprises an active layer, a first electrode, a second electrode, and a receiving line, wherein the gate is connected to a preset signal line in the signal line array, the first electrode is connected to a positive electrode of the photoelectric converter, the second electrode is connected to a preset receiving line in the receiving line array, and a negative electrode of the photoelectric converter is connected to the preset signal line.

As shown in FIG. 3-2, this step may comprise the following three sub-steps.

In sub-step 3031, at least one valid electrical signal is screened out from the electrical signals acquired through various receiving lines in the receiving line array, wherein a voltage of the valid electrical signal is greater than that of a corresponding signal line.

An external control circuit may comprise a detection circuit and an information acquisition circuit, wherein the detection circuit may be configured to judge whether a voltage of an electrical signal received by each receiving line is greater than a voltage of a corresponding signal line, and determine an electrical signal with a voltage greater than a voltage of a signal line in a sub-pixel region where the receiving line is located as a valid electrical signal. This is because the voltage of the electrical signal received by the receiving line is equal to a sum of the voltage of the signal line and a voltage into which the photoelectric converter converts light (the voltage has the same direction as that of the voltage of the signal line), and if the sum is less than the voltage of the signal line, it indicates that the circuit may be faulty, the electrical signal received by the receiving line is invalid, and at this time, the receiving line may be detected again to confirm a specific problem.

The detection circuit may transmit the valid electrical signal to the information acquisition circuit.

In sub-step 3032, a standard value φ of each of the at least one valid electrical signal is acquired according to a preset formula.

The information acquisition circuit may acquire a standard value φ of each of the at least one valid electrical signal according to a preset formula. The preset formula may be $$\varphi = \frac{V_p - V_g}{V_g},$$

where $V_p$ is the voltage of the effective signal and $V_g$ is the voltage of the signal line. The preset formula is only illustrative, and the standard value of each valid electrical signal may also be acquired according to other formulas, which is not limited in the embodiment of the present disclosure.

The information acquisition circuit may store the standard value of each valid electrical signal.

In sub-step 3033, optical information is acquired according to the standard value of each valid electrical signal.

After standard values of all the valid electrical signals in the photosensor array are acquired, the optical information may be acquired according to the standard values. As an example, the optical information may be acquired according to position information of photosensors corresponding to the standard values, pixel colors of the photosensors corresponding to the standard values, and sizes of the standard values and the like, to implement various functions. The method for acquiring the optical information according to the electrical signals can be known with reference to the related art, and details thereof will not be described here again.

As an example, in the embodiment of the present disclosure, when the array substrate is used for display, for any column of sub-pixel regions, level signals on signal lines, data lines, and receiving lines in $n^{th}$ and $(n+1)^{th}$ rows of sub-pixel regions may be shown in FIG. 3-3. It can be seen that when there are electrical signals on the signal lines, corresponding photoelectric converters are turned on, the receiving lines may receive the electrical signals, and adjacent two rows of photoelectric converters may sequentially acquire the electrical signals in an order of powering on the signal lines. In addition, when the array substrate is not used for display, there may not be level signals on the data lines in FIG. 3-3.

In summary, the method for controlling an array substrate according to the embodiment of the present disclosure reduces lines to be provided and increases an aperture ratio of the array substrate by turning on the photoelectric converters through the signal lines. The present disclosure solves the problem of providing a large number of lines and devices in the array substrate in the related art which may affect the aperture ratio of the array substrate. The present disclosure achieves an effect that the photosensors can be provided on the array substrate in a case where a small number of lines are provided.

The embodiments of the present disclosure further provide a method for manufacturing an array substrate, which is used to manufacture any of the array substrates shown in FIG. 1 and FIGS. 2-1 to 2-6.

The embodiments of the present disclosure further provide a display device comprising any of the array substrates shown in FIG. 1 and FIGS. 2-1 to 2-6.

The term "and/or" in the present disclosure is merely an association relationship for describing associated objects, indicating that there may be three relationships, for example, A and/or B, which may indicate only A, both A and B, and only B. In addition, the character "/" herein generally indicates that the associated objects have an "or" relationship.

It is pointed out that in the accompanying drawings, sizes of layers and regions may be exaggerated for clarity of illustration. It can also be understood that when an element or layer is referred to as being "on" another element or layer, it may be directly on the other element or there may be an intermediate layer. In addition, it can be understood that when an element or layer is referred to as being "under" another element or layer, it may be directly under the other element or there may be more than one intermediate layer or element. In addition, it can also be understood that when a layer or element is referred to as being "between" two or two elements, it may be a single layer between two layers or elements, or there may be more than one intermediate layer or element. Like reference signs indicate like elements throughout.

In the present disclosure, the terms "first," "second," and "third" are used for descriptive purposes only and are not to be construed as indicating or implying relative importance. The term "plurality" refers to two or more, unless specifically defined otherwise.

It can be understood by those of ordinary skill in the art that all or part of the steps for implementing the above embodiments may be implemented by hardware, or may be implemented by programs instructing related hardware, wherein the programs may be stored in a computer readable storage medium, which may be a read only memory, a magnetic disk or an optical disk and the like.

The above description is only the preferred embodiment of the present disclosure, and is not intended to limit the present disclosure. Any modifications, equivalent substitutions, improvements, and the like. Within the spirit and principles of the present disclosure should be included in the protection scope of the present disclosure.

We claim:

1. An array substrate, comprising:
a base substrate; and
an array of first thin film transistors, a signal line array, a photosensor array and a receiving line array, each provided on the base substrate,
wherein
each first thin film transistor in the array of first thin film transistors is connected to one signal line in the signal line array,
each photosensor in the photosensor array is connected to one signal line in the signal line array and one receiving line in the receiving line array, and lenses are provided on at least one photosensor in the photosensor array on a side thereof away from the base substrate, so as to form a lens array,
each photosensor in the photosensor array comprises a second thin film transistor and a photoelectric converter, wherein the second thin film transistor has a gate connected to the signal line and a negative electrode of the photoelectric converter, a first electrode connected to a positive electrode of the photoelectric converter, and a second electrode connected to the receiving line,
the second thin film transistor comprises an active layer,
the base substrate has a base layer, the active layer, a first insulating layer, a second insulating layer and a third insulating layer provided thereon in an order from bottom to top, wherein the first insulating layer and the second insulating layer have a first via hole provided therein, the second insulating layer has a second via hole provided therein, the first insulating layer, the second insulating layer, and the third insulating layer have a third via hole provided therein, and orthogonal ections of the first via hole, the second via hole and the third via hole on the base substrate are ail within a range of an orthogonal projection of the active layer on the base substrate,
the gate is provided in the second via hole, and the photoelectric converter is provided on the gate,
the first electrode is provided on the second insulating layer and is electrically connected to the active layer through the first via hole,
the second electrode is provided in the third via hole and is electrically connected to the active layer, and
the receiving line is provided on the third insulating layer and is electrically connected to the second electrode through the third via hole, wherein the receiving line and the second electrode are formed by the same patterning process.

2. The array substrate according to claim 1, wherein each of the lenses is selected from a micro-lens array, a Fresnel lens or a liquid crystal lens.

3. The array substrate according to claim 2, wherein in a case that the lenses are liquid crystal lenses, each of the liquid crystal lenses comprises a liquid crystal layer and a control electrode configured to control a focal length of the liquid crystal lens.

4. The array substrate according to claim 3, wherein the liquid crystal lenses are provided on a light exiting side of the array substrate.

5. A display device, comprising the array substrate according to claim 2.

6. The array substrate according to claim 1, wherein the first electrode is made of a transparent conductive material.

7. The array substrate according to claim 1, wherein an ohmic contact layer is further formed at a position where at least one of the first electrode and the second electrode is in contact with the active layer.

8. The array substrate according to claim 1, wherein the base substrate further comprises a data line array provided thereon,
wherein an arrangement direction of receiving lines in the receiving line array is parallel to an arrangement direction of data lines in the data line array.

9. The array substrate according to claim 8, wherein the array substrate is divided by the signal lines and the data lines into a plurality of sub-pixel regions in a crisscross manner, wherein a number of photosensors in the photosensor array is less than or equal to a number of the sub-pixel regions.

10. The array substrate according to claim 9, wherein a photosensor is provided in every n sub-pixel regions along at least one of the arrangement direction of the data lines and the arrangement direction of the signal lines, where n is an integer greater than or equal to 2.

11. The array substrate according to claim 1, wherein the base substrate further comprises a data line array provided thereon,
wherein an arrangement direction of receiving lines in the receiving line array is parallel to an arrangement direction of signal lines in the signal line array.

12. The array substrate according to claim 11, wherein the array substrate is divided by the signal lines and the data lines into a plurality of sub-pixel regions in a crisscross manner,
wherein a number of photosensors in the photosensor array is less than or equal to a number of the sub-pixel regions.

13. The array substrate according to claim 12, wherein a photosensor is provided in every n sub-pixel regions along at least one of the arrangement direction of the data lines and the arrangement direction of the signal lines, where n is an integer greater than or equal to 2.

14. The array substrate according to claim 1, wherein the photosensor array is located in an opening region of the array substrate.

15. A method for controlling the array substrate according to claim 1, comprising:
controlling, through the signal lines, the photosensors to be turned on;
receiving, through the receiving lines, electrical signals generated by the photosensors; and
acquiring optical information according to the electrical signals.

16. The method according to claim 15, wherein the step of controlling, through the signal lines, the photosensors to be turned on comprises:
controlling, through voltages in the signal lines, the photosensors to be turned on while controlling, through the voltages, the array substrate to be used for display.

17. The method according to claim 16, wherein the step of acquiring optical information according to the electrical signals comprises:
screening out at least one valid electrical signal from the electrical signals acquired through various receiving lines, wherein a voltage of the valid electrical signal is greater than a voltage of a corresponding signal line;
acquiring a standard value φ of each valid electrical signal according to the following formula:

$$\varphi = \frac{V_p - V_g}{V_g},$$

where $V_p$ is the voltage of the valid signal and $V_g$ is the voltage of the signal line; and
acquiring the optical information according to the standard value of the valid electrical signal.

18. A display device, comprising the array substrate according to claim 1.

* * * * *